United States Patent [19]

Reardon et al.

[11] Patent Number: 4,733,290

[45] Date of Patent: Mar. 22, 1988

[54] SEMICONDUCTOR DEVICE AND METHOD OF FABRICATION

[75] Inventors: Bruce A. Reardon, Brockton; Joel L. Goodrich, Westford, both of Mass.

[73] Assignee: M/A-COM, Inc., Burlington, Mass.

[21] Appl. No.: 853,706

[22] Filed: Apr. 18, 1986

[51] Int. Cl.[4] ............... H01L 23/48; H01L 29/44; H01L 29/52; H01L 29/60

[52] U.S. Cl. ................................. 357/69; 357/59

[58] Field of Search ............ 357/69, 15, 22 H, 59 R, 357/49

[56] References Cited

U.S. PATENT DOCUMENTS

| | | | |
|---|---|---|---|
| 3,462,650 | 8/1969 | Hennings et al. | 357/59 R X |
| 3,559,283 | 2/1971 | Kravitz | 357/69 X |
| 3,566,214 | 2/1971 | Usuda | 357/69 X |
| 3,912,556 | 10/1975 | Grenon et al. | 357/59 R X |
| 4,499,656 | 1/1985 | Fabian et al. | 357/15 X |

FOREIGN PATENT DOCUMENTS 2028583 3/1980 United Kingdom .

Primary Examiner—Martin H. Edlow
Assistant Examiner—Sara W. Crane
Attorney, Agent, or Firm—Wolf, Greenfield & Sacks

[57] ABSTRACT

A semiconductor device and associated method of fabrication in which the device includes a semiconductor substrate having a cavity therein extending in a frame pattern. An insulating layer such as one of silicon nitride is deposited in the cavity followed by the deposition of polysilicon to substantially fill the cavity and provide structural support. An epitaxy layer is formed over the surface of the substrate along with a second insulating layer having windows defined therein for enabling ohmic contact with the epitaxy layer and substrate, respectively. Metallization is deposited to form separate beam leads to provide ohmic contact at the epitaxy layer and substrate.

6 Claims, 19 Drawing Figures (E)

(F)

SEMICONDUCTOR DEVICE AND METHOD OF FABRICATION

BACKGROUND OF THE INVENTION

The present invention relates in general to semiconductor devices and the method of fabrication thereof. More particularly, the present invention relates to an improved technique for the fabrication of rugged semiconductor beam lead devices while maintaining proper microwave performance. Even more particularly, the invention relates to an improved method of fabrication of Schottky beam lead diodes featuring a solid dielectric frame preferably of polysilicon encompassing the entire active silicon region and providing exceptional physical durability at no sacrifice to microwave performance.

One problem with conventional beam lead devices is that they are extremely fragile. They can be easily destroyed by a force of about 3 grams which is roughly equivalent to the weight of a dime. This means that even if wafer yields are good, production yields suffer because devices are destroyed in transit, during testing, and when assembled into the systems for which they are intended. Because these devices may be used in large quantities it is highly desirable to have a high assembly yield. This is particularly necessary when semi-skilled people are being used for assembly which many times is the case.

The conventional beam lead device employs a glass for support, typically frit glass. By way of example, see British Patent No. 2,028,583 that describes the use of a glass frit for beam lead support. However, glass is a notoriously difficult material to work with. Also, parasitic capacitances can vary significantly from device to device often forcing the use of sorting procedures before shipment to a customer. One of the disadvantages of the use of a frit glass is that the glass must be fired at fairly high temperature. When this is done, the final electrical performance of the device suffers due to out-diffusion from the heavily doped substrate into the lightly doped epitaxy.

Another problem with frit glass is that it is difficult to machine. It must be machined after it has been applied to the wafer to replanarize the wafer. If this is not done, high resolution photolithography becomes impossible to perform because, without lapping, the wafer has a non-planar surface. However, when the surface is machined, other difficulties arise: it is very easy to machine part of the epitaxy away.

Moreover, the glassed beam lead devices are expensive because of the costly processing, which requires many complicated steps when working with frit glass. For example, severe problems occur when a design calls for fritted glass and requires the glass to be mixed in solution, to be applied and fired and to be defined within a very strict, fine geometry. It is difficult to carry out and yields problems primarily regarding the parasitic capacitance of the device. If a number of wafers are examined, for example, some will have adequate capacitance while others will have capacitance that is too high or too low.

Other problems associated with the use of glass include the fact that it is not a semiconductor material and is thus not compatible with the semiconductor substrate. Frit glass has substantial impurities and when used in the usual high temperature processing causes wafer contamination. The glass frit also has poor thermal match to a silicon based wafer.

Accordingly, it is an object of the present invention to provide an improved semiconductor device and associated method of fabrication for in particular providing a beam lead device that is exceptionally rugged in construction.

Another object of the present invention is to provide an improved method of fabrication of a beam lead type device without requiring the use of a glass support but which instead employs a polysilicon deposition technique which has been found to be substantially more process-friendly than with the use of a frit glass.

A further object of the present invention is to provide an improved beam lead semiconductor device and associated method of fabrication in which the device has high wafer yields and production yields.

Still another object of the present invention is to provide a rugged beam lead device, preferably a Schottky beam lead device that is far less likely to be damaged than with existing devices. In accordance with the present invention the beam strength of the diodes exceed 10 grams and are typically 20 grams while with the use of a conventional glass frit the beam lead strength is 4 grams or less. Many standard planar beam lead diodes are generally rated at 4 grams or less.

A further objection of the present invention is to provide an improved semiconductor device and method of fabrication in which the method can be carried out for fabricating many different types of semiconductor devices such as in a balanced-mixer application where two of the beam lead devices are utilized. The principles may also be used in microwave detectors or high speed switches.

A further object of the present invention is to provide an improved technique for the fabrication of beam lead devices particularly Schottky beam lead diodes and in which the manufacturing can be carried out at a lower cost than presently possible.

Still another object of the present invention is to provide an improved semiconductor device and associated method of fabrication in which the device has almost perfect reproducibility from device to device and associated uniformity. This is carried out in accordance with the process of the present invention by controlling process steps so that the same device configuration is readily reproducible from device to device.

A further object of the present invention is to provide an improved beam lead device and associated process where each of the photo steps and the other steps in creating the device are carried out in a manner essentially operator-independent. This produces a process that results in high yield, and remarkable uniformity in each wafer and between wafers.

SUMMARY OF THE INVENTION

To accomplish the foregoing and other objects, features and advantages of the invention, there is provided an improved method for the fabrication of semiconductor devices and in particular for the fabrication of beam lead type devices including two or more terminal devices. It is an objective of the present invention to eliminate the use of a glass for support and in accordance with the invention there is instead provided a polysilicon deposition technique which is far more process-friendly than glass. This allows for the solution of many of the process problems associated with glass, such as high temperature firing and machining. In accordance with the invention the process includes the formation of a frame cavity in the semiconductor substrate. This cavity is provided preferably by anisotropic etching. The product is then lined with silicon nitrite, an insulating material. The polysilicon is deposited, then machined to replanarize the wafer. At this point what is left is an island of single-crystal silicon isolated in the polysilicon frame, hence the term isoplanar as it is isolated and yet planar. Once this step is completed then the epitaxy is grown. Because the epitaxy has seen no high temperature processing it is uneffected by outdiffusion from the substrate. After all of the defining and etching of the metal is completed and the device contact is made, the wafer is then secured to a ceramic disc and machined from the back side until very close to the final thickness of the body. It is then photolithographically protected and the rest of the silicon is etched away.

One of the problems associated with conventional beam leads is that when the back side of the silicon is etched, the body is undercut. The acid cuts into it and makes sloppy edges. Some edges are narrower and some are differently shaped, because acid etches in a non-uniform way. Naturally, this effects the parasitic capacitance of the device. However, with the isoplanar process of the present invention there is used a dielectric material on the back side of the device that does not etch, so that, when the acid hits the dielectric frame it automatically stops etching. In this way each device comes out with exactly the same shape. This results in unusually low and uniform parasitic capacitance of the device. Normally, the amount of silicon under the beam determines the MOS capacitance and the parasitic capacitance. However, in the process of the present invention these capacitances are always the same because of the uniformity of fabrication. The device's uniformity and inherent strength make it an ideal candidate for machine assembly on a production line. Because the process of the present invention is substantially absolutely uniform, it is possible to program a machine much more easily for assembly. This is the only known device of its type that has this degree of uniformity. Because the inherent ruggedness and good performance of the device, another factor that large quantity users consider is the advantage of closely matched device of availability. Because of the isoplanar fabrication process of the invention, the user can reasonably expect uniformity between one lot and the next.

BRIEF DESCRIPTION OF THE DRAWINGS

Numerous other objects features and advantages of the invention should now become apparent upon a reading of the following detailed description taken in conjunction with the accompanying drawings, in which.

DETAILED DESCRIPTION

As has been indicated previously, one of the objectives of the present invention is to provide a beam lead type device that is exceptionally rugged. It is desired to raise assembly line yields while using relatively untrained people to put together the systems that use the devices. In this connection handling can be quite crucial. A 20 percent breakage in testing alone is not unusual. Assembly line yields also suffer through handling.

One of the characteristics of the device of the present invention is its extreme ruggedness. When measuring according to MIL-STD-883B, the beam strength of diodes in accordance with the present invention exceeds 10 grams and is typically on the order of 20 grams, whereas established designs using conventional glass are rated at 4 grams or less. Other standard planar beam lead diodes are generally rated at 2 grams or less.

In accordance with the process of the present invention, there is provided a substantial increase in the uniformity in appearance and operation of the device. This uniformity holds across the wafer so that each device on the wafer is exactly the same from lot to lot. Thus, every wafer manufactured from this concept will look exactly the same and have exactly the same dimensions.

Another consideration in constructing the device of the present invention was to provide the best possible mechanical strength without losing performance. With the process of the present invention beam lead Schottky devices were fabricated having extreme uniformity and at the same time improved strength particularly in comparison with glass frit supported devices.

One objective of the present invention was to produce a device that would have a low noise figure at X and Ku bands. It was desired to have a high beam strength and a good, clean appearance. In this regard a conventional device (similar to many others currently in production with 0.1 pF capacitance) has a beam strength of only about 3 grams. For the same 0.1 pF, the device of the present invention can offer a beam strength of 20 grams typically which can make a significant difference in yield to the user who is working with a large volume of these devices. The user in other words obtains a device that offers the same electrical performance but is much stronger and more rugged. One particular Schottky beam lead diode built for the X band had a 6.5 db noise figure and about a 6 ohm series resistance. Its capacitance was about 0.15 pF and it had a specified beam strength of 10 grams minimum. As a matter of fact, some of the devices tested at a strength as much as 29 grams with the typical device being at about a strength of 20 grams. As previously stated, the average beam strength on a regular beam lead type device is only about 3 grams. This thus clearly illustrates the improved strength and ruggedness of the device of the present invention.

Figure 1:
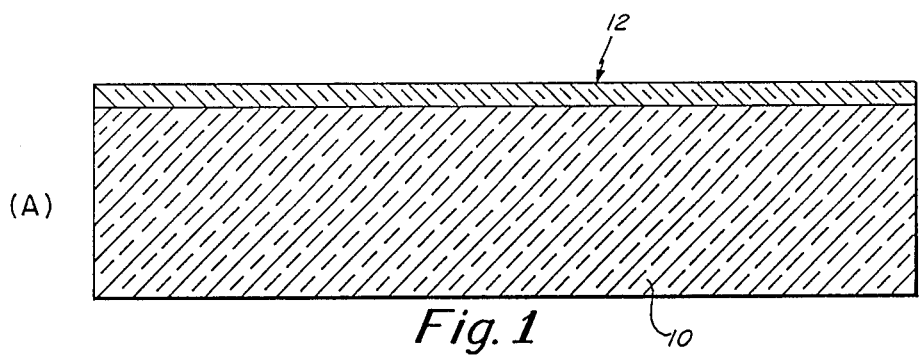
FIG. 1 illustrates an initial step in the process in which a silicon nitride layer has been deposited on the silicon substrate.

Reference is now made in particular to the drawings herein for illustrating a process for practicing the present invention. FIG. 1 shows what may be considered as the first step in the process identified as step A. FIG. 1 illustrates the substrate 10. This substrate may be of single crystal silicon or can be of other type of semiconductor material such as, for example, gallium arsenide. Step A in FIG. 1 involves the deposition of a layer of silicon nitride identified in FIG. 1 as layer 12. This may be deposited by a chemical vapor deposition technique. The layer 12 is an insulating layer. Alternatively, the layer may be formed by thermally growing silicon dioxide.

Figure 2:
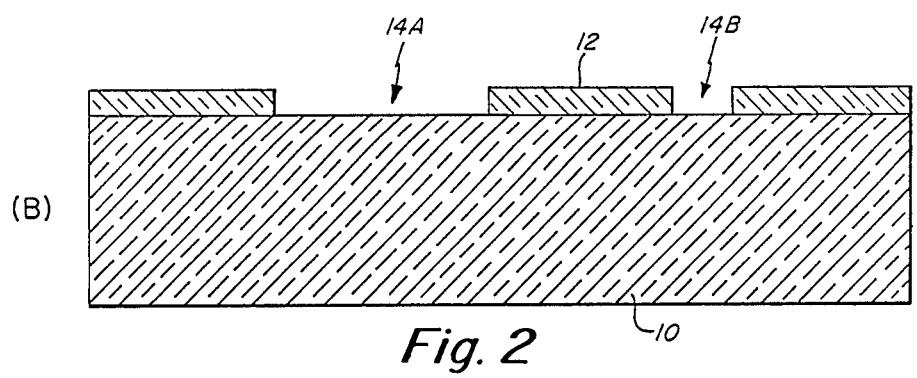
FIG. 2 illustrates the formation of windows in the silicon nitride layer.

FIG. 2 shows the next step in the process which is identified as step B in which portions of the layer 12 are etched away. This etching is by means of a conventional photolithographic technique leaving window areas at 14A and 14B. The remaining layer 12 that has not been removed forms a mask for subsequent process steps such as illustrated in FIG. 3.

Figure 3:
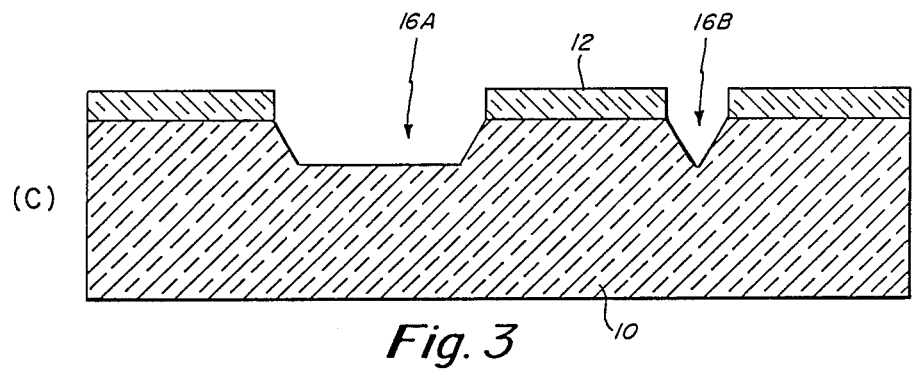
FIG. 3 illustrates the step of anisotropic etching.

The next step of the process identified in FIG. 3 as step C involves an anisotropic etching. This particular form of etching is preferred, in comparison to isotropic etching, so as to provide a controlled form of etching as illustrated in FIG. 3. This provides the desired tapered cavities as indicated at 16A and 16B in FIG. 3. This anisotropic etching is a process that can be closely controlled to provide the substantially V-shaped cavities of 16A and 16B.

Figure 4:
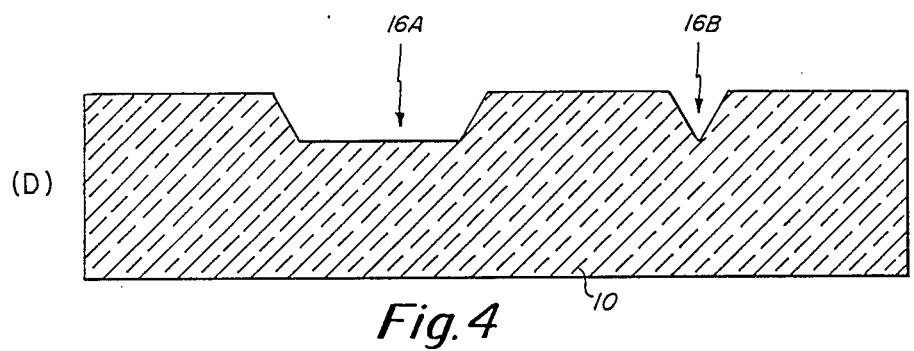
FIG. 4 illustrates removal of the silicon nitride layer.

Reference is next made to FIG. 4 which illustrates step D. This involves removal or stripping of the nitride mask layer 12. To carry this out one may employ a wet chemical etching process well known in the art.

Figure 5:
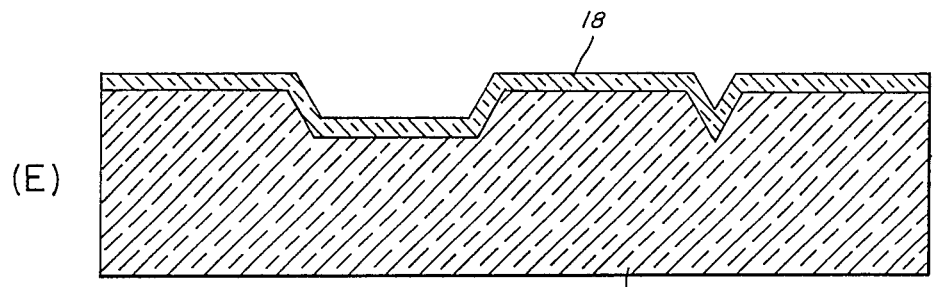
FIG. 5 illustrates the redepositing of a silicon nitride layer.

Reference is now made to FIG. 5 which shows the next step in the process. This is identified in FIG. 5 as the step E in which there is a redeposition of silicon nitride. This is illustrated in FIG. 5 by the deposition of the layer 18 uniformally over the surface of the substrate 10 as previously etched to create the cavities 16A and 16B. It is noted in FIG. 5 that the deposition of the layer 18 fills these cavities. The layer 18 of silicon nitride may be deposited by chemical vapor deposition.

Figure 6:
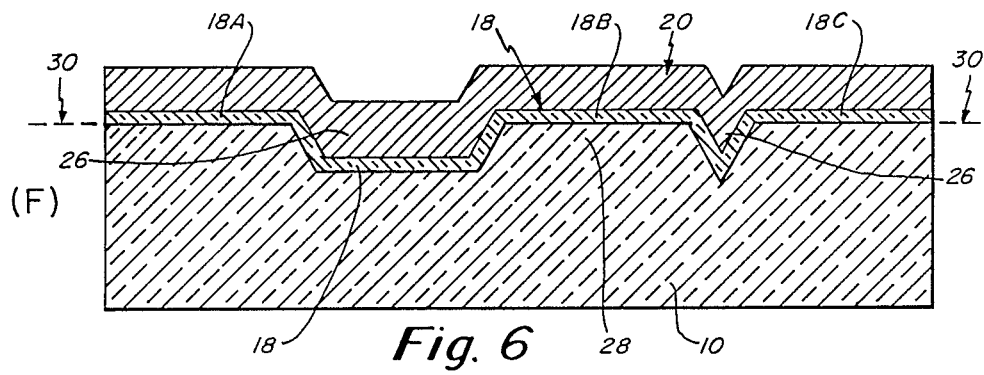
FIG. 6 illustrates deposition of the polysilicon layer.

The next step in the process is illustrated in FIG. 6 as step F in which there is deposited a further relatively thick layer 20, particularly in comparison with the layer 18 in FIG. 5. The layer 20 also provides a uniform thickness layer that is of polysilicon. The polysilicon is also deposited by a conventional vapor deposition process.

It is noted that those skilled in the art discounted the use of polysilicon primarily because it was known to have a relatively high dielectric constant, higher than that of glass. This had the effect of increasing the parasitic capacitance and thus apparently making polysilicon not desirable for this purpose. In this regard, glass has a dielectric constant of 5.5 while polysilicon has a dielectric constant of approximately 12.0.

However, any increase in parasitic capacitance it was found was offset by constructing the device, as described in further detail hereinafter, so that one of the beam leads was spaced from the silicon device area of the product. Furthermore, a thin metal finger was used extending from this beam lead to the device to compensate for the increase in parasitic capacitance due to the use of the polysilicon. Also, to control the parasitic capacitance an air bridge was defined under the finger. Further details of this construction are described hereinafter.

Figure 7A:
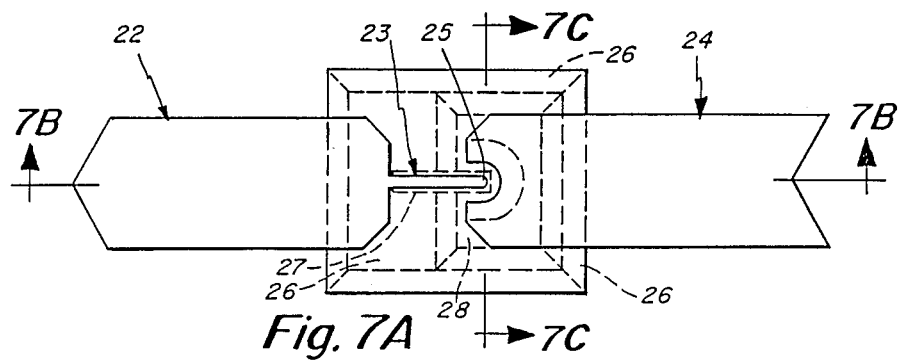
FIGS. 7A, 7B and 7C illustrate the beam lead device of the present invention in a more schematic fashion also illustrating respective cross sections.
Figure 7B:
Figure 7C:

With regard to the beam lead construction as it relates to the active area of the device, reference is now made to FIGS. 7A, 7B and 7C. FIG. 7A in particular illustrates the typography of the beam leads. FIG. 7A shows the beam lead 22 and also the beam lead 24. Also note the finger 23 extending from the beam lead 22 to make ohmic contact with the device at 25. FIGS. 7B and 7C clearly illustrate the solid polysilicon frame at 26 substantially surrounding the silicon device area at 28. In this regard the reference characters 26 and 28 are also set forth in FIG. 6 to show the corresponding areas there.

It is noted that in FIG. 6 we are only partially into the overall process of fabrication of the device, whereas, in FIGS. 7A–7C the device is shown in a more schematic fashion as a completed device. FIG. 6 is a cross-section that illustrates the process but it is understood that, from the plan view of FIG. 7A, the etching that forms the frame 26. The etching that forms the cavity for receiving the polysilicon to form the frame 26 actually extends in a frame construction as illustrated in FIG. 7A so as to substantially entirely surround the silicon device area at 28. The frame 26 is also identified in FIG. 7A as well as the silicon device area at 28.

Note has been made previously of the conventional use of glass for contact support and beam lead devices. This has generally been used as a final step in the fabrication of beam lead devices because it can be carried out at relatively low temperatures without degrading the silicon device itself and in particular the thin epitaxy layer thereof. As such, one skilled in the art would further discount the use of polysilicon because deposition thereof is carried out at relatively high temperatures which would definitely degrade the lightly doped thin epitaxy layer of the device.

Figure 8:
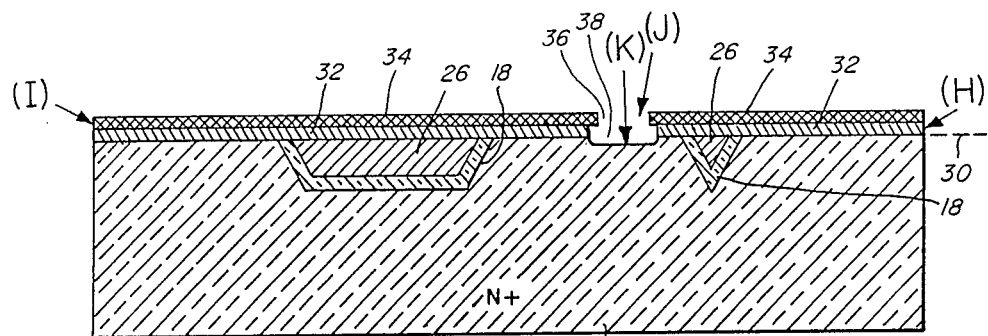
FIG. 8 illustrates subsequent steps in the preferred process including polishing, epitaxy layer growth, and chemical vapor deposition of a silicon dioxide layer along with the formation of windows therein.

However, in accordance with the invention, the support layer as illustrated in FIGS. 6 and 8 of the application, is deposited at a relatively early step in the process before the epitaxy layer is formed and thus the epitaxy layer is not thus subject to any high temperature degradation.

Reference is now made to FIG. 8 which illustrates actually a series of subsequent process steps. First, the polysilicon is ground and/or polished. This is considered to be step G. The polishing occurs to the line 30 in FIG. 6. This leaves a continuous polysilicon frame 26 but at the same time does remove portions of the layer 18 such as the portions 18A, 18B and 18C in FIG. 6. However, it is noted that the silicon nitride layer 18 remains as a base layer upon which the polysilicon has been deposited to define the frame 26. FIG. 8 illustrates the next step in the process which is step H which is the deposition of the epitaxy layer 32. This is a lightly doped silicon layer that is preferably deposited by chemical vapor deposition. It is noted that the substrate 10 is heavily doped of N-type. The layer 32 is an intrinsic silicon layer forming the epitaxy layer. Where this layer is deposited over the substrate 10 it is of single crystal silicon and where it is deposited over the polysilicon it takes the form of a polysilicon which is a multi-crystal structure. It is noted in FIG. 8 that multiple steps are shown, however, it is to be noted that one of the intermediate steps prior to steps J and K is one in which the layer 32 is deposited over the entire top surface of the previously polished device.

The next step is identified in FIG. 8 as step I and it involves the deposition of a silicon dioxide layer 34 that may be considered as a mask layer. The silicon dioxide layer may also be deposited by a chemical vapor deposition technique.

The next step illustrated in FIG. 8 involves the steps J and K. The step J is an etching step carried out by conventional photolithographic techniques so as to form a window 36 in only the silicon dioxide layer. This thus exposes the epitaxy layer 32 through the window 36.

The next step in the process is identified in FIG. 8 as the step K and involves the subsequent etching of the epitaxy layer 32 at 38 in FIG. 8. In addition to etching through the epitaxy layer 32, the etchant also etches into the substrate 10. This will be for the purpose of providing ohmic contact into the base substrate. The etching of the epitaxy and base layer may be carried out by a wet chemical etching process that is of conventional nature.

Figure 9:
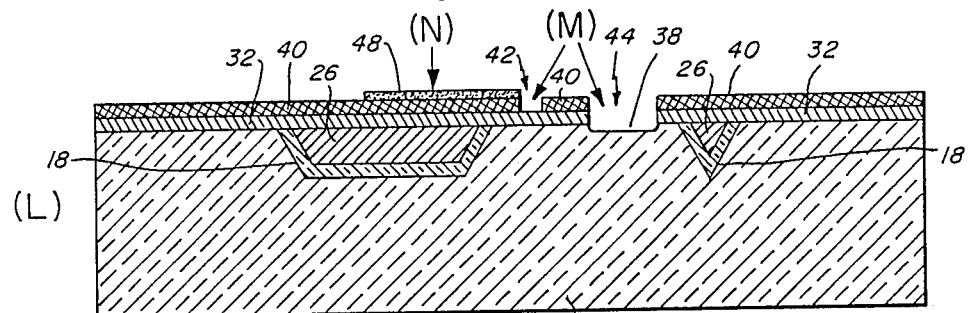
FIG. 9 illustrates subsequent steps including redepositing of a silicon dioxide layer and application of a photoresist for defining the air gap under the beam lead finger.

The next step in the process is identified in FIG. 9 and is identified as step L. Step L simply involves the stripping of the mask layer 34 from over the epitaxy layer 32. Thus, in FIG. 9 it is noted that the layer 34 is not illustrated but the remaining epitaxy layer 32 is.

The next step in the process identified in FIG. 9 which is actually carried out in two steps identified in FIG. 9 as process step M. There is first redeposited a silicon dioxide layer 40. This layer will cover the entire top of the epitaxy layer 32 and also will extend into the area 38. The second part of the step involves the formation of windows at 42 and 44 in FIG. 9. These windows may be formed in the silicon dioxide layer 40 by a conventional photolithographic technique. The window 42 will enable ohmic contact to the epitaxy layer 32 and the window 44 will enable ohmic contact to the substrate 10.

FIG. 9 shows one final step identified in FIG. 9 as step N which relates to the defining of the air gap under the finger 23 previously referred to in connection with FIG. 7A. In this regard note the air gap 50 in FIG. 10 to be described hereinafter. The step N involves the application of a photoresist at 48 in a pattern substantially matching or possibly slightly larger than the configuration of the finger 23. It is understood that at the sequence of steps in FIG. 9 the finger has not been formed yet as no metallization has yet occurred. The concept is to apply a photoresist, metalize over the photoresist and then remove the photoresist thereafter so as to form the air gap under the finger. In this regard refer to FIG. 7A which shows in dotted outline at 27 what might be an approximate pattern for the photoresist 48.

Figure 10:
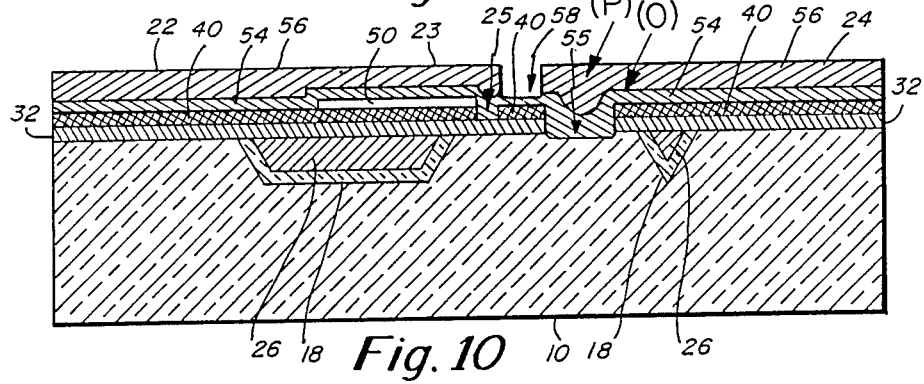
FIG. 10 is a diagram illustrating one of the final steps in producing the device including the metallization steps.

The next step of the process is illustrate in FIG. 10 and commences the metallization steps that actually form the beam leads. In this connection in FIG. 10 note the beam leads 22 and 24 along with the finger 23 and the gap 50 under the finger 23. As indicated previously, this air gap 50 is instrumental in maintaining the parasitic capacitance at a sufficiently low level. It is also noted from FIG. 10 that the main portion of the beam lead 22 is substantially spaced from the ohmic contact at 25 which also is instrumental in maintaining low parasitic capacitance of the device. This has been made possible at least in part by the isometric frame construction as clearly illustrated in FIGS. 7A and 7B.

The first metallization step is to deposit a metal layer by sputtering. This is identified in FIG. 10 as the layer 54 which actually extends over the photoresist 48 and substantially fills the windows 42 and 44 referred in FIG. 9. This deposition by sputtering usually includes the deposition of at least 2 metallic layers including a barrier metal such as a titanium/tungston alloy with the outer metal that is deposited usually gold. For the sake of simplicity in FIG. 10 this is show as simply a single layer. It forms the contact 25 referred to previously and also the contact 55 that provides ohmic contact with the substrate 10. In providing the layer 54, it is noted that this is a relatively thin metallic layer, particularly in comparison with the plating that occurs subsequently. In FIG. 10 the sputtering step is identified as step 0.

After the deposition by sputtering the next step is a plating step identified in FIG. 10 as step P for formation of the beam leads 22 and 24 along with the finger 23. In FIG. 10 note the plating layer 56. The plating occurs to a relatively substantial thickness particularly in comparison to the thickness of the sputtered metal layer. Areas that are not to be plated are covered with photoresist such as area 58 in FIG. 10 where there certainly has to be a conductive gap between the beam leads. However, it is noted that at 58 there is a relatively thin sputtered metal layer that occurred during the previous sputtering step.

As indicated previously, areas that are not to be plated are covered with a photoresist. These would be the areas identified in FIG. 7A outside of the beam leads 22 and 24 and the finger 23.

After the plating step has been completed the photoresist is then stripped so as to expose in addition to the plated portions also the background metallization from the previous sputtering step. The next step is to etch the metal so as to essentially remove all background metal. This etching step removes the metal at 58, for example, in FIG. 10. This etching also has the effect of removing a small amount of the plating but the amount that is removed is relatively insignificant. The etching continues until all of the background metal has been removed. This then brings you down to the silicon dioxide layer 40 which for the moment remains.

After the etching step has been completed then the photoresist 48 is removed. This may be removed by the use of an oxygen plasma atmosphere to remove the photoresist 48 thus leaving the air gap 50 under the finger 23. There are thus two photoresist steps that occur in connection with metallization. One occurs before the sputtering step to allow for the formation of an air gap under the finger 23. The second photoresist is used to mask the wafer for plating so as to form the basic beam leads.

Figure 11:
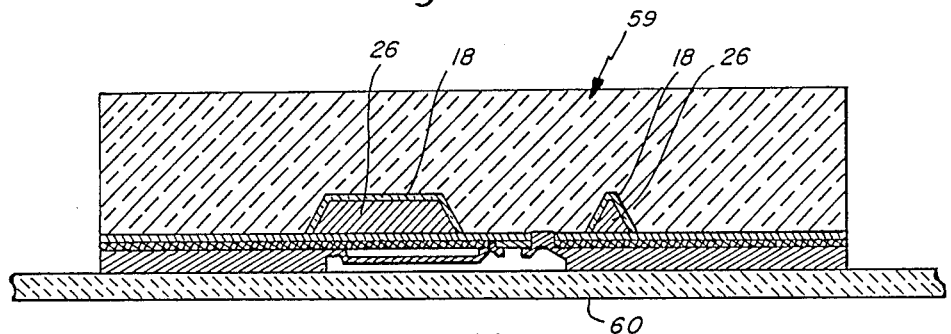
FIG. 11 illustrates the step of mounting the wafer for subsequent lapping.

The next step in the process is illustrated in FIG. 11 in a somewhat schematic fashion. This involves the mounting of the wafer 59 on the support 60. The wafer 59 is substantially illustrated in FIG. 10 but is in an inverted position. The wafer 59 is typically cemented to the support 60. The support 60 is typically a ceramic disc.

Figure 12:
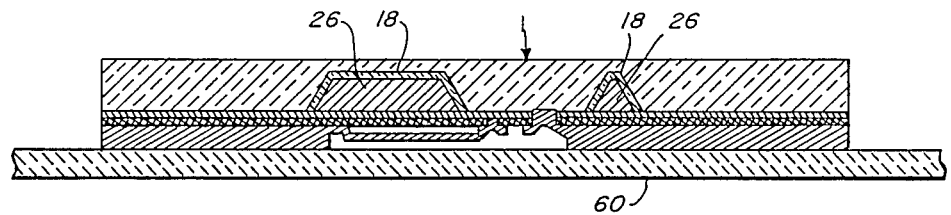
FIG. 12 illustrates the lapping of the wafer.

FIG. 12 illustrates the next step in the process which is the lapping of the wafer 59. This lapping is carried out in a controlled manner so that the wafer is lapped to a position in which the layer 18 and the polysilicon have not yet been exposed.

Figure 13:
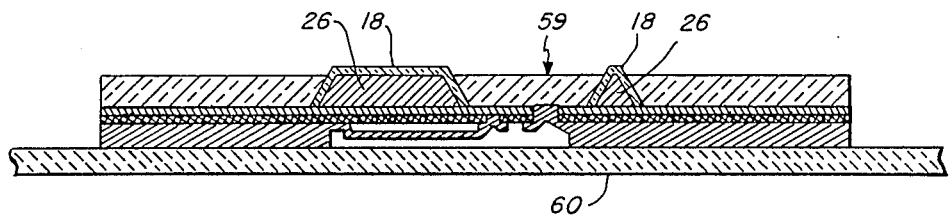
FIG. 13 illustrates an initial etching step of the wafer to expose the frame of the device.

The next step in the process is illustrated in FIG. 13 in which the wafer 59 and in particular the base substrate 10 is etched so as to sufficiently expose the layer 18. This etching may be carried out by a chemical etch until the bottom of the frame is exposed as indicated in FIG. 13. The etching step illustrated in FIG. 13 it is noted is of a type that etches only the silicon substrate but does not etch the silicon nitride layer 18.

Figure 14:
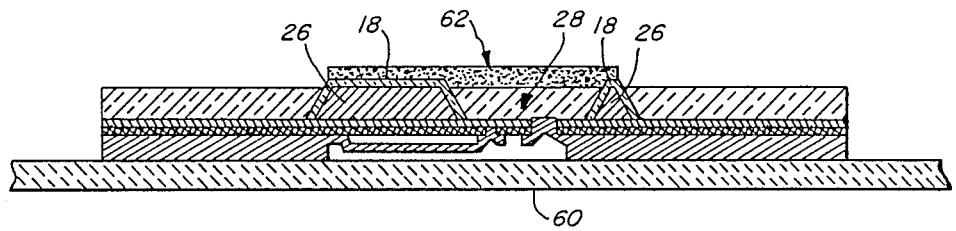
FIG. 14 illustrates the step of applying a photoresist to protect the basic silicon substrate device area.

FIG. 14 now describes the next step in the process in which there is applied a photoresist at 62. This photoresist extends across the frame 26 and is essentially a protective layer for preventing any further etching of the silicon that will define the basic silicon device area such as illustrated in FIGS. 7A–7C as the area 28. This is also described in FIG. 14.

Figure 15:
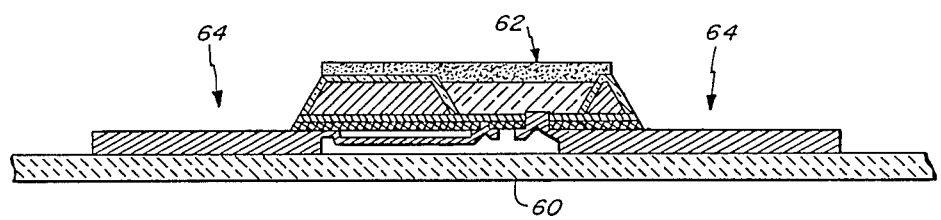
FIG. 15 illustrates a continuing etching step to expose the beam leads.
Figure 16:
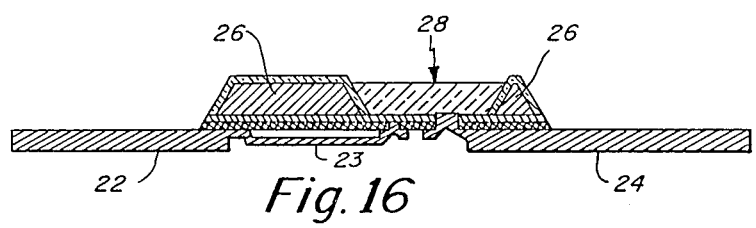
FIG. 16 illustrates the final device construction with the photoresist removed and with the beam leads now completely formed.

After the photoresist is applied as described in FIG. 14, then the etching continues so as to remove the silicon substrate in areas where the photoresist is not applied. In this connection refer to FIG. 15 which illustrates areas 64 where the substrate has been removed. The etching continues until all peripheral silicon is removed including the removal of the silicon dioxide layer 40 that is exposed. The etching continues until all of the peripheral silicon is removed exposing the bottom of the beam leads. The device then takes the form described schematically in FIG. 16. FIG. 16 illustrates the beam leads 22 and 24, the finger 23 and the frame 26. The ohmic contacts are as illustrated in FIG. 10.

As indicated previously, the device of the present invention is made by a process that allows much more uniformity in appearance and electrical performance. This uniformity holds across the wafer so that each device on the wafer is exactly the same from lot to lot. Thus, every wafer manufactured from the design should look exactly the same and have substantially the same dimensions.

In this regard, one of the problems with conventional beam leads is that when the back side of the silicon is etched, the body is undercut. The acid cuts into the body and makes for sloppy edges. Some edges are narrower and some are differently shaped because acid etches in a non-uniform manner. Naturally, this effects the parasitic capacitance of the device.

Now, with the present invention there is provided a dielectric material on the back side of the device. In this regard, refer to the layer 18 that is deposited at an early stage of the process. This layer does not etch, so that, when the acid hits the dielectric frame it automatically stops etching. Each device comes out with substantially the same shape. This results in unusually low and uniform parasitic capacitance.

Because of this uniformity and inherent strength, the device is an ideal candidate for machine assembly on a production line. No glass Schottky diode could be used this way because they are not at all as uniform. With the process of the invention the devices are absolutely uniform and it would be easy to program a machine for assembly.

Figure 17:
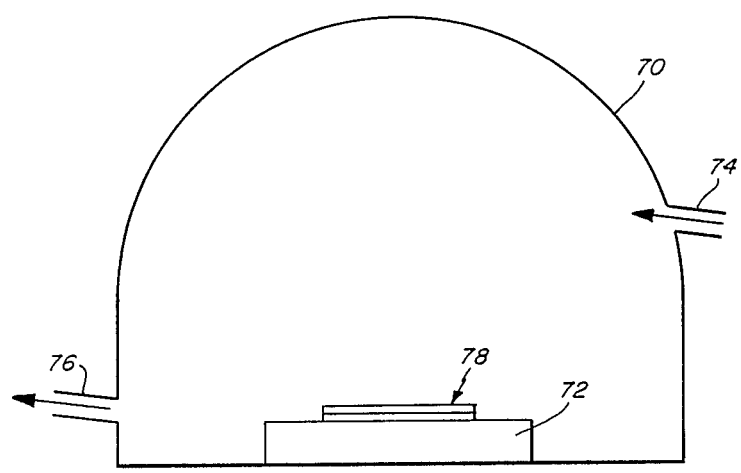
FIG. 17 is a schematic diagram of a deposition chamber that may be used with the process of this invention.

The polysilicon that is employed in providing the support frame may be deposited, as indicated previously, by a chemical vapor deposition technique. In this regard, refer to FIG. 17 which shows a deposition chamber 70 supporting therein a susceptor 72 and having an inlet 74 and an exhaust outlet 76. FIG. 17 also shows the wafer at 78. The chamber 70 is to be heated to a temperature on the order of 1000° C. and a silicon bearing gas is introduced at the inlet 74. For example, this may be silane or alternatively, silicon tetrachloride gas. This causes deposition of a polysilicon on the wafer as previously referenced in FIG. 6.

Silicon is a single crystal structure. For instance, the substrate 10 if of silicon, is of a single crystal silicon. On the other hand, polysilicon is comprised of multiple crystals. These crystals are grouped together to form the polysilicon.

The use of polysilicon particularly in comparison with glass has a number of advantages associated therewith. The polysilicon is readily machinable. On the other hand, glass is not easily machined. Polysilicon has extremely uniform physical properties across the entire wafer and from wafer to wafer within a run. On the other hand, glass is non-uniform. For example, frit glass may have air bubbles therein.

The polysilicon is also compatible with high temperature processing steps because it is deposited at a high temperature and so is compatible with the later step of forming the epitaxy layer. Polysilicon is a very pure semiconductor. Glass on the other hand is really not a semiconductor material and is thus non-compatible to the silicon substrate. Frit glass in particular has many impurities including metals. During the glass forming step there is a degradation and contamination of the wafer that may occur. The polysilicon has a good thermal match to the silicon substrate while glass does not.

Because the polysilicon closely relates to the silicon substrate there is a very close thermal expansion coefficient between them. This assists in wafer processing and also in the environmental stability of the device. The device of the present invention is more durable particularly in extreme temperature range applications. The matching of the thermal coefficient of expansion is important in preventing cracking or fracture of the wafer or individual devices.

Another problem with the use of gas referred to before is related to the fact that the material is generally fired at a fairly high temperature. When this is done, final electrical performance suffers due to outdiffusion from the heavily doped substrated into the lightly doped epitaxy layer. Another problem with frit glass is that it is difficult to machine. It must be machined after it has been applied to the wafer to replanarize the wafer. If this is not, high resolution photolithography becomes impossible to perform because, without lapping, the wafer has a non-planar surface. However, when the surface is machined, other difficulties arise: it is very easy to machine part of the epitaxy away.

Having now described a particular process for fabricating a device of the invention, it should now be apparent to those skilled in the art that numerous other modifications in the process and device are also contemplated as falling within the scope of the present invention. There has been described herein a process for the fabrication of a Schottky beam lead diode. However, it is understood that the principles of the invention may also be employed in constructing other two terminal or multi-terminal devices. The principles of the invention also relate to either beam lead type devices or non-beam lead type devices. The principles of the invention may also be employed in constructing monolithic circuits. These circuits may include other Schottky type devices such as a multi-junction Schottky (quads and tees). The concepts of the invention may also be employed in fabricating PIN beam lead devices.

What is claimed is:

1. a semiconductor device comprising,
a base semiconductor substrate,
means defining a closed peripheral cavity in the substrate extending in frame configuration,
an insulating layer in the cavity,
a layer of polysilicon disposed over the insulating layer to substantially fill the cavity and provide structural support,
an epitaxy layer disposed over the surface of the substrate as well as over the insulating and polysilicon layers,
a second insulating layer having windows defined therein for enabling ohmic contact with the epitaxy layer and substrate, respectively,
and separate conductor leads to provide contact to the epitaxy layer and substrate respectively,
said semiconductor substrate and epitaxy layer being oppositely doped to form a device region,
said insulating layer in the cavity being non-reactant to the etching of the substrate while permitting etching of the substrate so as to enable exposure of the conductor leads,
said conductor leads comprising beam leads that extend in opposite directions from the substrate,
at least one of said beam leads having a major area thereof spaced by a minor area in comparison to the major area so as to space the major area from the device region to thus minimize parasitic capacitance.

2. A semiconductor device as set forth in claim 1 wherein said cavity is formed by an anisotorpic etching technique.

3. A semiconductor device as set forth in claim 1 with the device region geing asymmetrically disposed in the polysilicon frame.

4. A semiconductor device as set forth in claim 1 wherein said one of said beam leads has its minor area formed as a thin width conductive finger extending from said major area and to provide ohmic contact to the device.

5. A semiconductor device as set forth in claim 4 including an air gap defined under the conductive finger between the conductive finger and the second insulating layer to minimize parasitic capacitance.

6. A semiconductor device as set forth in claim 5 wherein the conductive finger is of a width at least an order of magnitude less than the width of said major area.

* * * * *